United States Patent
Jeon et al.

(10) Patent No.: US 12,552,619 B2
(45) Date of Patent: Feb. 17, 2026

(54) WAFER TRANSFER APPARATUS, WAFER TRANSFER SYSTEM, AND METHOD FOR REMOVING PARTICLES IN WAFER TRANSFER APPARATUS

(71) Applicant: Samsung Electronics Co., Ltd., Suwon-si (KR)

(72) Inventors: Hyun Joo Jeon, Suwon-si (KR); Jin Hyuk Choi, Suwon-si (KR); Kyu Sang Lee, Suwon-si (KR); Myung Ki Song, Suwon-si (KR); Ji Ho Uh, Suwon-si (KR); Kong Woo Lee, Suwon-si (KR); Hyun Soo Chun, Suwon-si (KR); Beom Soo Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 234 days.

(21) Appl. No.: 18/371,707

(22) Filed: Sep. 22, 2023

(65) Prior Publication Data
US 2024/0279003 A1    Aug. 22, 2024

(30) Foreign Application Priority Data

Feb. 16, 2023 (KR) .................. 10-2023-0020756
May 12, 2023 (KR) .................. 10-2023-0061446

(51) Int. Cl.
B65G 47/90    (2006.01)
(52) U.S. Cl.
CPC .................................. B65G 47/90 (2013.01)

(58) Field of Classification Search
CPC ... B23Q 1/48; B25J 5/002; B25J 9/104; B25J 9/1615; B25J 15/0233; B25J 15/0286; B25J 19/0075; B25J 19/0079; H01L 21/67742; H01L 21/67766
See application file for complete search history.

(56) References Cited

U.S. PATENT DOCUMENTS 8,683,643 B2    4/2014 Jung
10,170,351 B2   1/2019 Chang et al.
(Continued)

FOREIGN PATENT DOCUMENTS

JP    2007242702 A    9/2007
KR    1020060122287 A   11/2006
(Continued)

*Primary Examiner* — Saul Rodriguez
*Assistant Examiner* — Brendan P Tighe
(74) *Attorney, Agent, or Firm* — Muir Patent Law, PLLC (57) ABSTRACT

A wafer transfer apparatus includes a plate, a first belt unit on a first surface of the plate and including a first linear motion (LM) guide movable up and down, a second belt unit on the first surface of the plate and including a second LM guide movable up and down, a robot between the first belt unit and the second belt unit connected to the first LM guide and the second LM guide, and configured to transfer a wafer in a vertical direction, and a buffer unit between the first belt unit and the second belt unit in a first direction and disposed between the plate and the robot in a second direction perpendicular to the first direction, wherein the buffer unit includes a plurality of centrifugal fans configured to discharge fluid from an inner space of the buffer unit to an outside of the buffer unit.

19 Claims, 10 Drawing Sheets

(56) References Cited

U.S. PATENT DOCUMENTS

| | | | |
|---|---|---|---|
| 2001/0035065 A1* | 11/2001 | Hashimoto | F16M 11/08 |
| | | | 74/490.04 |
| 2007/0147976 A1* | 6/2007 | Rice | H01L 21/67225 |
| | | | 414/217 |
| 2007/0147982 A1* | 6/2007 | Rice | H01L 21/67742 |
| | | | 414/800 |
| 2008/0166208 A1* | 7/2008 | Lester | H01L 21/68707 |
| | | | 414/217 |
| 2008/0166210 A1* | 7/2008 | Hudgens | H01L 21/67742 |
| | | | 901/41 |
| 2013/0323002 A1* | 12/2013 | Furuichi | H01L 21/67742 |
| | | | 414/744.5 |
| 2016/0218031 A1* | 7/2016 | Inada | B25J 19/0079 |
| 2021/0028030 A1 | 1/2021 | Kong et al. | |
| 2022/0059395 A1* | 2/2022 | Dogome | H01L 21/67017 |
| 2022/0270912 A1* | 8/2022 | Ide | H01L 21/67184 |
| 2023/0074285 A1* | 3/2023 | Ditmore | B25J 19/0079 |

FOREIGN PATENT DOCUMENTS

| | | |
|---|---|---|
| KR | 1020080081692 A | 9/2008 |
| KR | 1020120049753 A | 5/2012 |

\* cited by examiner

WAFER TRANSFER APPARATUS, WAFER TRANSFER SYSTEM, AND METHOD FOR REMOVING PARTICLES IN WAFER TRANSFER APPARATUS

CROSS-REFERENCE TO RELATED APPLICATION

This application claims priority from Korean Patent Application No. 10-2023-0020756 filed on Feb. 16, 2023 and priority from Korean Patent Application No. 10-2023-0061446 filed on May 12, 2023 in the Korean Intellectual Property Office, and all the benefits accruing therefrom under 35 U.S.C. 119, the contents of which in their entireties are herein incorporated by reference.

BACKGROUND

Field

The present disclosure relates to a wafer transfer apparatus, a wafer transfer system, and a method for removing particles in the wafer transfer apparatus.

Description of Related Art

Components of a EFEM (Equipment Front End Module) applied to semiconductor process equipment include a loadport on which a FOUP (Front Opening Unified Pod) is seated. The loadport has a stack structure to minimize a robot transfer space. Accordingly, a chamber-type VFEM (Vertical Front End Module) may be provided that can increase daily production of wafers per unit area and minimize an installation area.

However, due to the nature of the process equipment, when the robot that transfers the wafer moves up and down, particles generated due to the robot's mechanical friction may leak into the VFEM system where the wafer is present, due to a compression effect and a pressure rise occurring in a space at each of both opposing ends of the VFEM system.

SUMMARY

A technical purpose to be achieved by the present disclosure is to provide a wafer transfer apparatus with improved apparatus reliability.

Another technical purpose to be achieved by the present disclosure is to provide a wafer transfer system with improved system reliability.

Still another technical purpose to be achieved by the present disclosure is to provide a method for removing particles in the wafer transfer apparatus with improved method reliability.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

In accordance with an aspect of the disclosure, a wafer transfer apparatus includes a plate; a first belt unit on a first surface of the plate and including a first linear motion (LM) guide movable up and down; a second belt unit on the first surface of the plate and including a second LM guide movable up and down; a robot between the first belt unit and the second belt unit, wherein the robot is connected to the first LM guide and the second LM guide, and is configured to transfer a wafer in a vertical direction; and a buffer unit between the first belt unit and the second belt unit in a first direction, the buffer unit being between the plate and the robot in a second direction perpendicular to the first direction, wherein the buffer unit includes a plurality of centrifugal fans configured to discharge fluid from an inner space of the buffer unit to an outside of the buffer unit.

In accordance with an aspect of the disclosure, a wafer transfer system includes a main apparatus including a plate; a first belt unit and a second belt unit disposed on a first surface of the plate; a buffer unit disposed between the first belt unit and the second belt unit; and a robot unit disposed between the first belt unit and the second belt unit to transfer a wafer vertically along the buffer unit; a first auxiliary apparatus on a left side of the main apparatus to supply the wafer to the main apparatus while a process is performed; and a second auxiliary apparatus on a right side of the main apparatus to supply the wafer to the main apparatus while the process is performed.

In accordance with an aspect of the disclosure, a method for removing particles in a wafer transfer apparatus includes providing a wafer transfer apparatus including a plate; a first belt unit on a first surface of the plate and including a first linear motion (LM) guide movable up and down; a second belt unit on the first surface of the plate and including a second LM guide movable up and down; a robot between the first belt unit and the second belt unit, wherein the robot is connected to the first LM guide and the second LM guide, and is configured to transfer a wafer in a vertical direction; and a buffer unit between the first belt unit and the second belt unit in a first direction, the buffer unit being between the plate and the robot in a second direction perpendicular to the first direction, wherein the buffer unit includes a plurality of centrifugal fans configured to discharge fluid from an inner space of the buffer unit to an outside of the buffer unit; moving, by the first LM guide of the first belt unit and the second LM guide of the second belt unit, the robot in a direction from a lower end of the plate to an upper end of the plate, wherein due to movement of the first LM guide and the second LM guide, a pressure inside each of the first belt unit and the second belt unit increases such that fluid containing particles generated inside each of the first belt unit and the second belt unit flows into the buffer unit; and discharging, by the plurality of centrifugal fans, the fluid containing the particles received in the buffer unit out of the buffer unit.

It should be noted that the effects of the present disclosure are not limited to those described above, and other effects of the present disclosure will be apparent from the following description.

BRIEF DESCRIPTION OF DRAWINGS

The above and other aspects and features of the present disclosure will become more apparent by describing in detail illustrative embodiments thereof with reference to the attached drawings, in which.

DETAILED DESCRIPTIONS

For simplicity and clarity of illustration, elements in the drawings are not necessarily drawn to scale. The same reference numbers in different drawings represent the same or similar elements, and as such perform similar functions. Further, descriptions and details of well-known steps and elements are omitted for simplicity of the description. Furthermore, in the following detailed description of the present disclosure, numerous specific details are set forth to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included in the idea and scope of the present disclosure as defined by the appended claims.

A shape, a size, a ratio, an angle, a number, etc. disclosed in the drawings for illustrating embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the idea and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the apparatus in use or in operation, in addition to the orientation depicted in the figures. For example, when the apparatus in the drawings may be turned over, elements described as "below" or "beneath" or "under" other elements or features would then be oriented "above" the other elements or features. Thus, the example terms "below" and "under" may encompass both an orientation of above and below. The apparatus may be otherwise oriented, for example, rotated 90 degrees or at other orientations, and the spatially relative descriptors used herein should be interpreted accordingly.

Hereinafter, with reference to the accompanying drawings, embodiments according to the technical idea of the present disclosure will be described.

Figure 1:
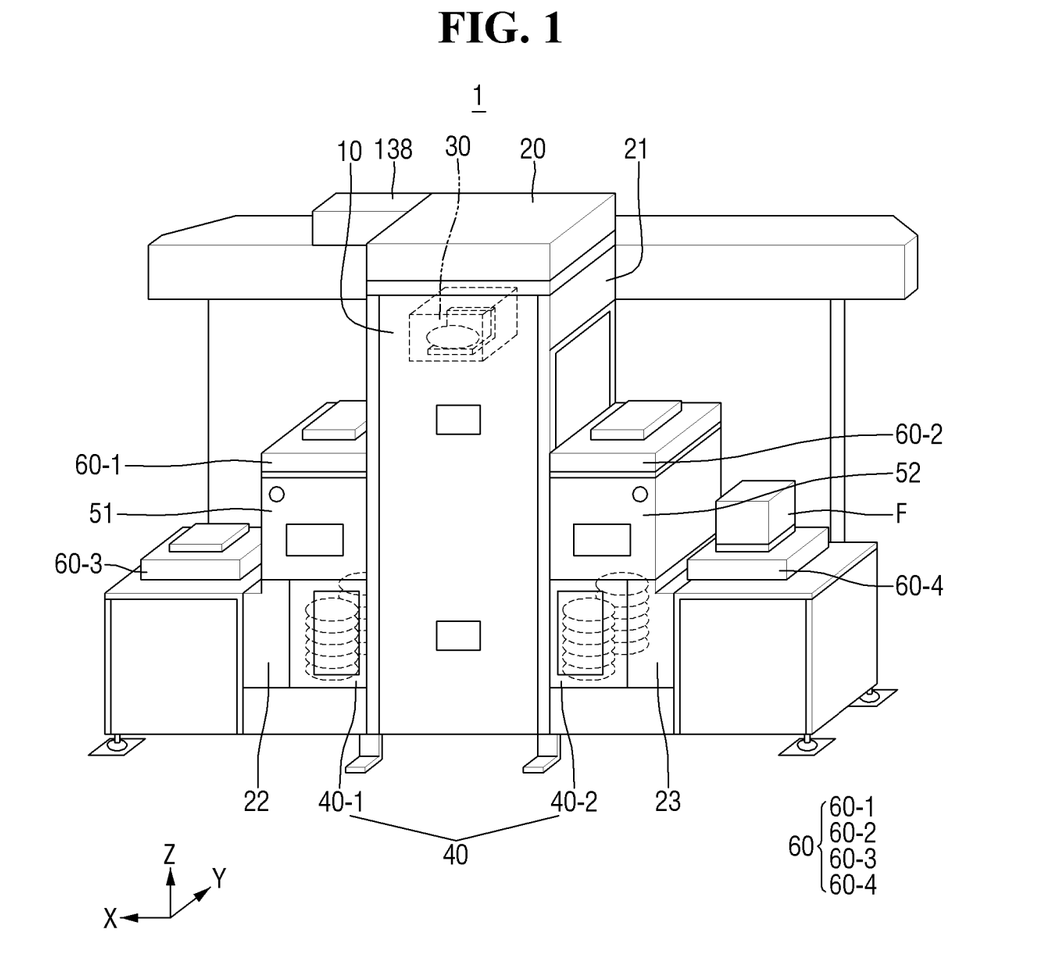
FIG. 1 is a diagram illustrating a VFEM (Vertical Front End Module) according to some embodiments.

FIG. 1 is a diagram illustrating a VFEM (Vertical Front End Module) according to some embodiments.

Referring to FIG. 1, a wafer transfer system (hereinafter, VFEM (Vertical Front End Module) system) 1 may include a wafer transfer apparatus 10, a topmost FFU (Fan Filter Unit) 20, a wafer aligner 30, a side buffer 40, and a loadport 60.

As shown in FIG. 1, the topmost FFU 20 may be located at a top level in the VFEM system 1, and may supply clean air to an inside of the VFEM system 1.

In some embodiments, the VFEM system 1 may include an upper-left FFU (not shown) and/or an upper-right FFU 21 disposed under topmost FFU 20. Accordingly, the upper-left FFU (not shown) and the upper-right FFU 21 disposed under topmost FFU 20 may prevent particles floating inside the VFEM system 1 from being settled on a wafer present in the wafer aligner 30 under airflow coming down from the topmost FFU 20.

In some embodiments, the VFEM system 1 may include a lower-left FFU 22 and a lower-right FFU 23, as shown in FIG. 1. Accordingly, the lower-left FFU 22 and the lower-right FFU 23 may prevent the particles floating inside the VFEM system 1 from being settled on the wafer present in the side buffer 40 under the airflow coming down from the topmost FFU 20.

The wafer aligner 30 may be located under the topmost FFU 20 in the VFEM system 1. Moreover, the wafer aligner 30 may perform orienting a flat zone or a notch of the wafer in a desired direction.

The side buffer 40 refers to a space where a number of wafers wait for a process or wait before moving to a FOUP F after the process has been performed thereon. The side buffer 40 may include a left side buffer 40-1 disposed on a left side of the wafer transfer apparatus 10, and a right side buffer 40-2 disposed on a right side of the wafer transfer apparatus 10.

The loadport 60 refers to a facility in which the FOUP F as a container which receives the wafer is seated. The loadport 60 may carry out transporting the wafer while opening or closing a door of the FOUP F. Moreover, as shown in FIG. 1, the loadport 60 may include a first loadport 60-1 disposed on an upper surface of a first block 51, a second loadport 60-2 disposed on an upper surface of a second block 52, a third loadport 60-3 disposed on a side surface of (e.g., next to) the first block 51, and a fourth loadport 60-4 disposed on a side surface of (e.g., next to) the second block. However, the number of loadports is not limited thereto.

Figure 2:
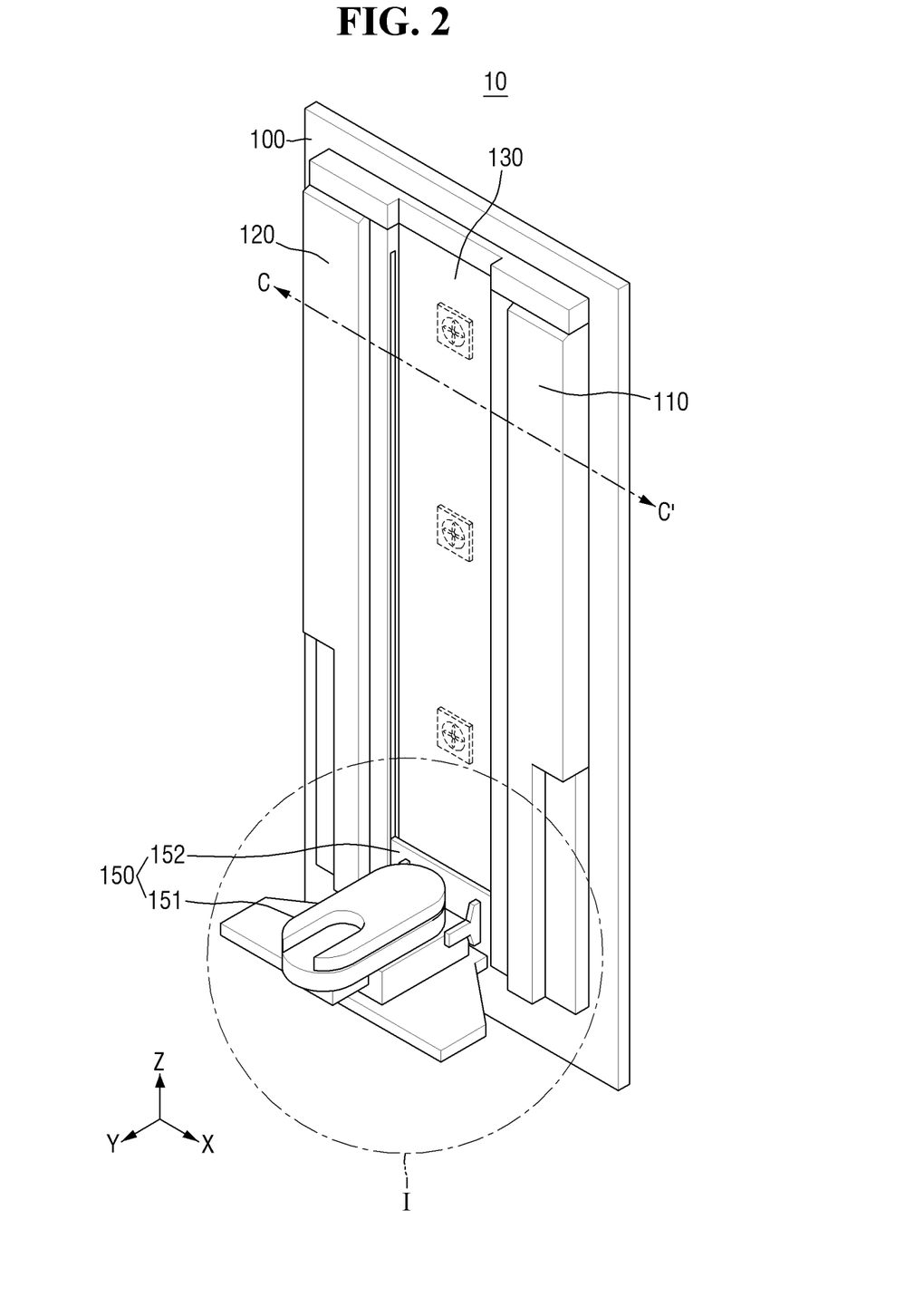
FIG. 2 is a diagram illustrating a wafer transfer apparatus according to some embodiments.
Figure 3:
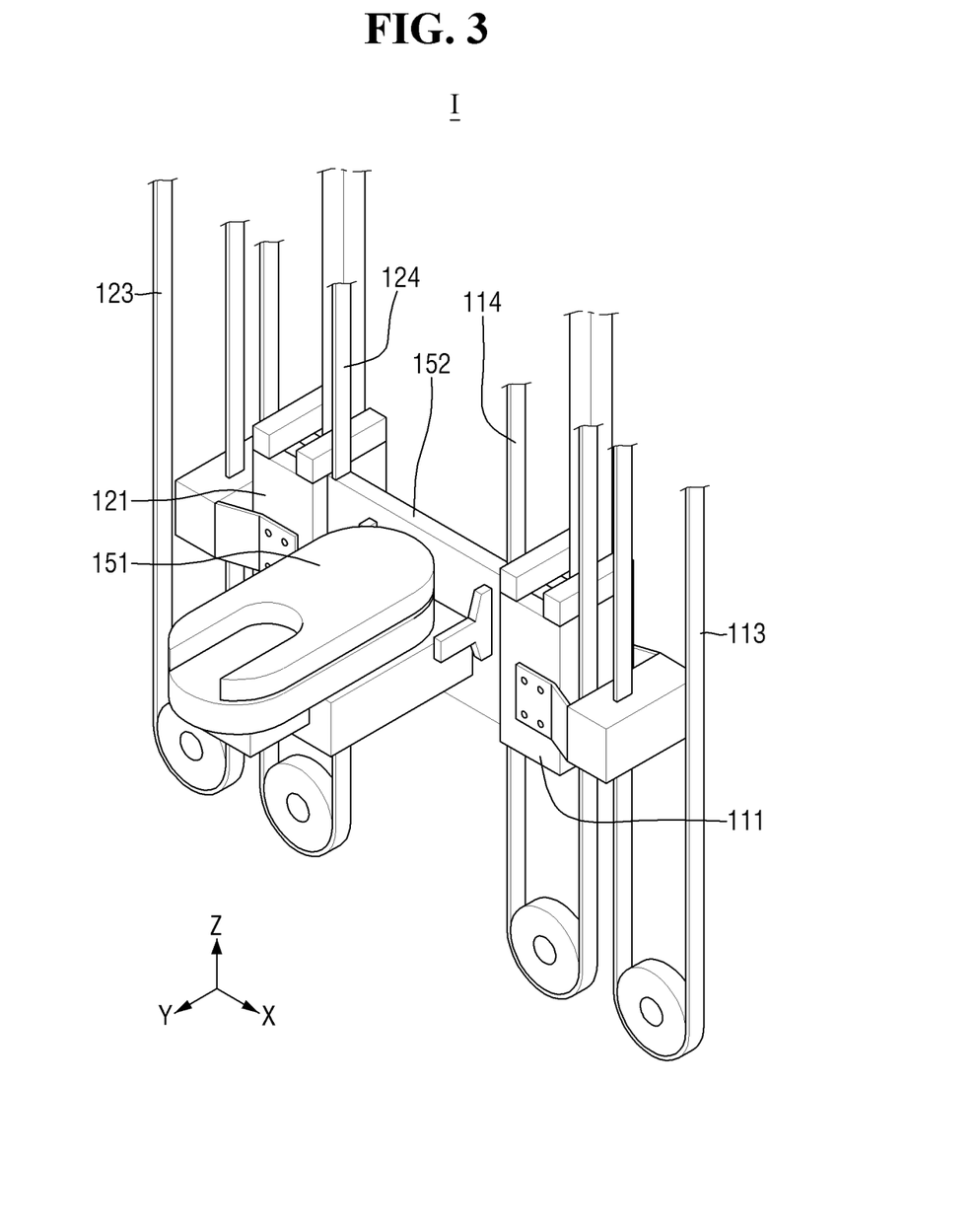
FIG. 3 is a schematic diagram illustrating a first area I of FIG. 2.
Figure 4:
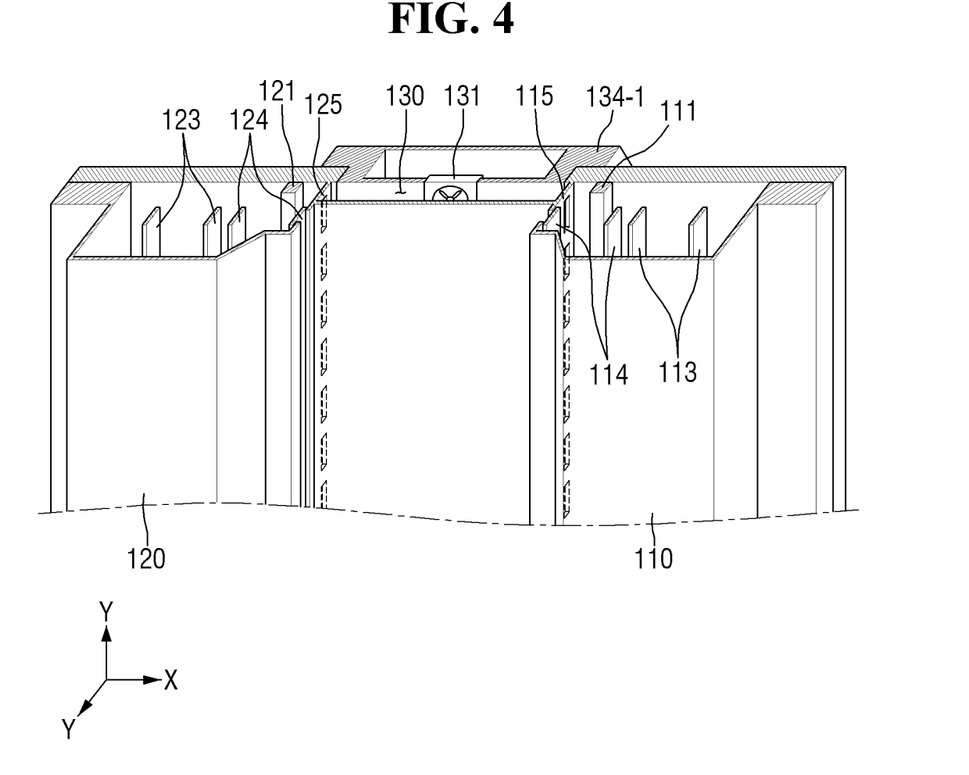
FIG. 4 is a perspective view of the wafer transfer apparatus as cut along C-C' in FIG. 2.

FIG. 2 is a diagram illustrating a wafer transfer apparatus according to some embodiments. FIG. 3 is a schematic diagram illustrating a first area I of FIG. 2. FIG. 4 is a perspective view of the wafer transfer apparatus as cut along C-C' in FIG. 2.

Referring to FIG. 2, the wafer transfer apparatus 10 may include a first plate 100, a first belt unit 110, a second belt unit 120, a buffer unit 130, and a robot unit 150.

As shown in FIG. 2, the first belt unit 110 and the second belt unit 120 of the wafer transfer apparatus 10 may be positioned on one surface of the first plate 100. Moreover, the first belt unit 110 and the second belt unit 120 may be spaced apart from each other while being disposed on one surface of the first plate 100.

The buffer unit 130 may be provided as a separate space defined between the first belt unit 110 and the second belt unit 120 of the wafer transfer apparatus 10. Moreover, the wafer transfer apparatus 10 according to the present disclosure is characterized in that an area of the first belt unit 110 and an area of the second belt unit 120 are connected to each other through the buffer unit 130. An effect thereof will be described below.

The robot unit 150 (e.g., the robot) may be disposed between the first belt unit 110 and the second belt unit 120 of the wafer transfer apparatus 10. In some embodiments, the robot unit 150 may include a transfer robot 151 for transferring the wafer, and a second plate 152 moving vertically along the buffer unit 130. Moreover, in some embodiments, the transfer robot 151 may be coupled to the second plate 152 and thus may move along the buffer unit 130 in the vertical direction while the second plate 152 moves vertically. The terms "robot unit" and "robot" should be understood as referring to, for example, a device including one or more motors, one or more arms, and/or at least one or more grabber hands or platforms.

Referring to FIG. 3, the first area I may include a first LM guide 111, a first transfer belt 113, and a first seal belt 114. Moreover, the first area I may include a second LM guide 121, a second transfer belt 123, and a second seal belt 124.

Although not shown in FIG. 3, the first belt unit 110 of FIG. 2 may include the first LM guide 111, the first transfer belt 113, and the first seal belt 114. Moreover, although not shown in FIG. 3, the second belt unit 120 in FIG. 2 may include the second LM guide 121, the second transfer belt 123, and the second seal belt 124.

The first LM guide 111 and the second LM guide 121 may be coupled to the second plate 152 of the robot unit (150 of FIG. 2) so as to move the transfer robot 151 in the vertical direction.

In some embodiments, the first LM guide 111 is coupled to the first transfer belt 113, as shown in FIG. 3, and moves up and down under a movement of the first transfer belt 113. For example, when the first transfer belt 113 moves in a clockwise direction, the first LM guide 111 may move upwardly in a Z direction. Moreover, for example, when the first transfer belt 113 moves in a counterclockwise direction, the first LM guide 111 may move downwardly in the Z direction.

In some embodiments, the second LM guide 121 is coupled to the second transfer belt 123, as shown in FIG. 3, and moves up and down under a movement of the second transfer belt 123. For example, when the second transfer belt 123 moves in the clockwise direction, the second LM guide 121 may move downwardly in the Z direction. Moreover, for example, when the second transfer belt 123 moves in the counterclockwise direction, the second LM guide 121 may move upwardly in the Z direction.

The first seal belt 114 may be disposed between the first LM guide 111 and the second plate 152 of the robot unit (150 in FIG. 2). Moreover, the first seal belt 114 may engage with and move together with the first LM guide 111.

The second seal belt 124 may be disposed between the second LM guide 121 and the second plate 152 of the robot unit (150 of FIG. 2). Moreover, the second seal belt 124 may engage with the second LM guide 121 and move together with the second LM guide 121.

Referring to FIG. 4, the first belt unit 110 may include a first fluid dispersion plate 115, the second belt unit 120 may include a second fluid dispersion plate 125, and the buffer unit 130 may include a first centrifugal fan 131.

In some embodiments, the first seal belt 114 may be configured to prevent particles due to mechanical friction under the movement of the first LM guide 111 inside the first belt unit 110 from escaping from the first belt unit 110 into the VFEM system.

Moreover, in some embodiments, the second seal belt 124 may be configured to prevent particles due to mechanical friction under the movement of the second LM guide 121 inside the second belt unit 120 from escaping from the second belt unit 120 into the VFEM system.

As shown in FIG. 4, the first fluid dispersion plate 115 may be disposed between the first belt unit 110 and the buffer unit 130. Moreover, the first fluid dispersion plate 115 may have a plurality of holes defined therein. Accordingly, the wafer transfer apparatus 10 may control fluid flow from the first belt unit 110 to the buffer unit 130 through the holes of the first fluid dispersion plate 115. Moreover, in some embodiments, sizes of the holes of the first fluid dispersion plate 115 may be different from each other. For example, the sizes of the holes of the first fluid dispersion plate 115 may gradually decrease as the first fluid dispersion plate 115 extends downwardly. For example, because fluid is discharged at the lower end of the first plate 100 as described below with reference to FIG. 5, the sizes of the holes of the first fluid dispersion plate 115 may gradually decrease as the first fluid dispersion plate 115 extends downwardly to control the amount of fluid discharged in the height direction.

As shown in FIG. 4, the second fluid dispersion plate 125 may be disposed between the second belt unit 120 and the buffer unit 130. Moreover, the second fluid dispersion plate 125 may have a plurality of holes defined therein. Accordingly, the wafer transfer apparatus 10 may control fluid flow from the second belt unit 120 to the buffer unit 130 through the holes of the second fluid dispersion plate 125. Moreover, in some embodiments, sizes of the holes of the second fluid dispersion plate 125 may be different from each other. For example, the sizes of the holes of the second fluid dispersion plate 125 may gradually decrease as the second fluid dispersion plate 125 extends downwardly.

The buffer unit 130 may include the first centrifugal fan 131. For example, the use of a centrifugal fan (instead of, e.g., an axial fan) may serve to overcome a flow resistance in the narrow space of the buffer unit 130 and the discharge ducts 134, 135, and 136 as described below with reference to FIG. 5. Moreover, the buffer unit 130 connected to the first belt unit 110 and the second belt unit 120 may more effectively prevent pressure rise inside each of the first belt unit 110 and the second belt unit 120 using the first centrifugal fan 131. Accordingly, leakage of the particles from each of the first belt unit 110 and the second belt unit 120 into the VFEM system due to the increase in the pressure inside each of the first belt unit 110 and the second belt unit 120 may be more effectively prevented. A more specific description thereof will be set forth below together with the effects of the present disclosure.

Figure 5:
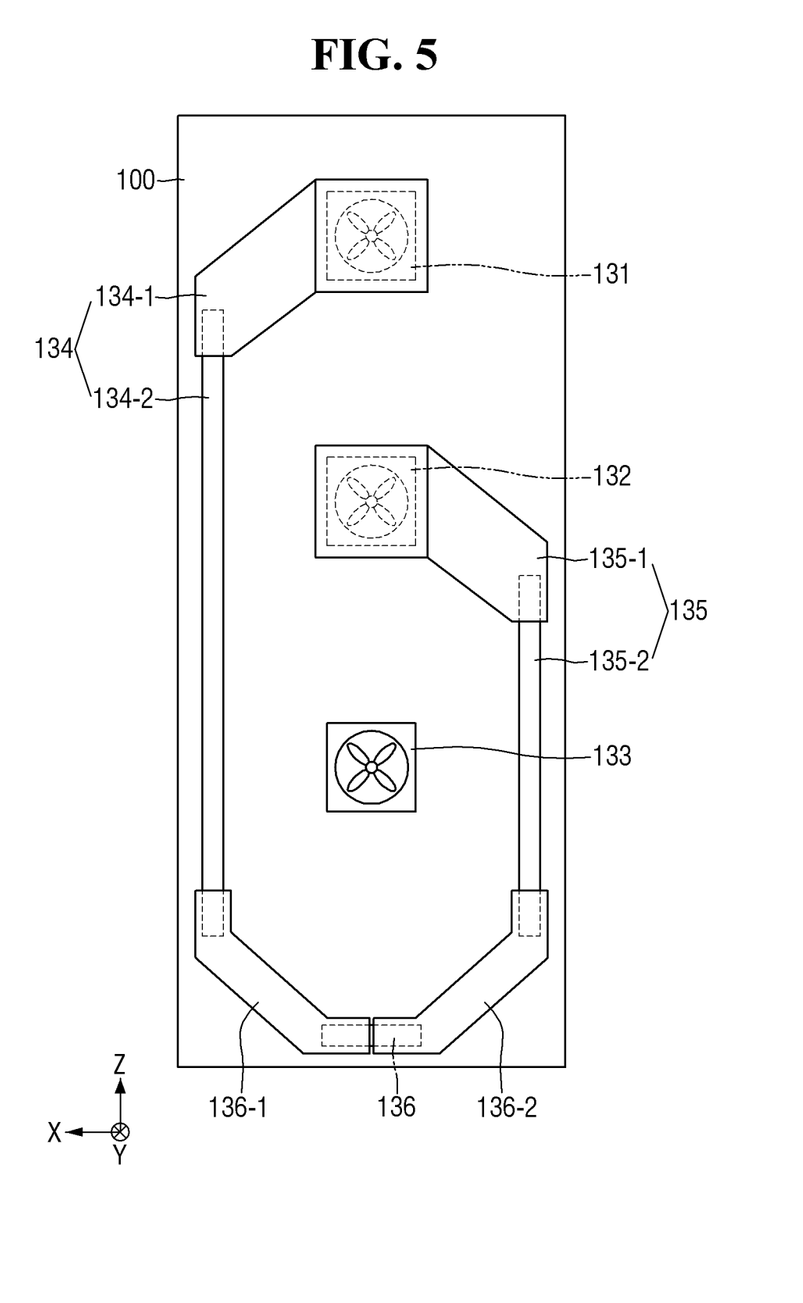
FIG. 5 is a diagram illustrating a plurality of centrifugal fans and a plurality of discharge ducts according to some embodiments.

FIG. 5 is a diagram illustrating a plurality of centrifugal fans and a plurality of discharge ducts according to some embodiments.

Referring to FIG. 5, the first centrifugal fan 131, a second centrifugal fan 132, a third centrifugal fan 133, a first discharge duct 134, a second discharge duct 135, and a third discharge duct 136 may all be formed on the first plate 100.

As shown in FIG. 4 and FIG. 5, the buffer unit 130 may include a plurality of centrifugal fans. For example, the buffer unit 130 may include the first centrifugal fan 131 received in the inner space thereof. The first centrifugal fan 131 may discharge the fluid in the inner space of the buffer unit 130 to the other side of the first plate 100 from the first belt unit 110.

That is, the buffer unit 130 may include the plurality of centrifugal fans, that is, the first centrifugal fan 131, the second centrifugal fan 132, and the third centrifugal fan 133 received in the inner space of the buffer unit 130. However, the number of centrifugal fans is not limited thereto. Moreover, the first centrifugal fan 131, the second centrifugal fan 132, and the third centrifugal fan 133 may discharge the fluid in the inner space of the buffer unit 130 to the other side of the first plate 100.

The first discharge duct 134 may include a first cover unit 134-1 disposed on the other side of the first plate 100 and covering a discharge hole of the first centrifugal fan 131, and a first connection unit 134-2 as a passage along which the fluid flowing out through the first cover unit 134-1 connected to the first centrifugal fan 131 flows.

The second discharge duct 135 may include a second cover unit 135-1 disposed on the other side of the first plate 100 and covering a discharge hole of the second centrifugal fan 132, and a second connection unit 135-2 as a passage along which the fluid flowing out through the second cover unit 135-2 connected to the second centrifugal fan 132 flows.

Moreover, the first discharge duct 134 and the second discharge duct 135 may be spaced apart from each other so that the fluid flowing through the first centrifugal fan 131 and the fluid flowing through the second centrifugal fan 132 do not interfere with each other. Moreover, in some embodiments, as shown in FIG. 5, the third centrifugal fan 133 may be free of a separate discharge duct connected to the third centrifugal fan 133.

The third discharge duct 136 may include a third connection unit 136-1 connected to the first discharge duct 134 at one end thereof, and a fourth connection unit 136-2 connected to the second discharge duct 135 at the other end thereof.

Accordingly, the first centrifugal fan 131 and the second centrifugal fan 132 may be connected to the first discharge duct 134 and the second discharge duct 135, respectively, and may discharge the fluid in the space of the buffer unit 130 to the third discharge duct 136 located at a lower end of the first plate 100.

Figure 6:
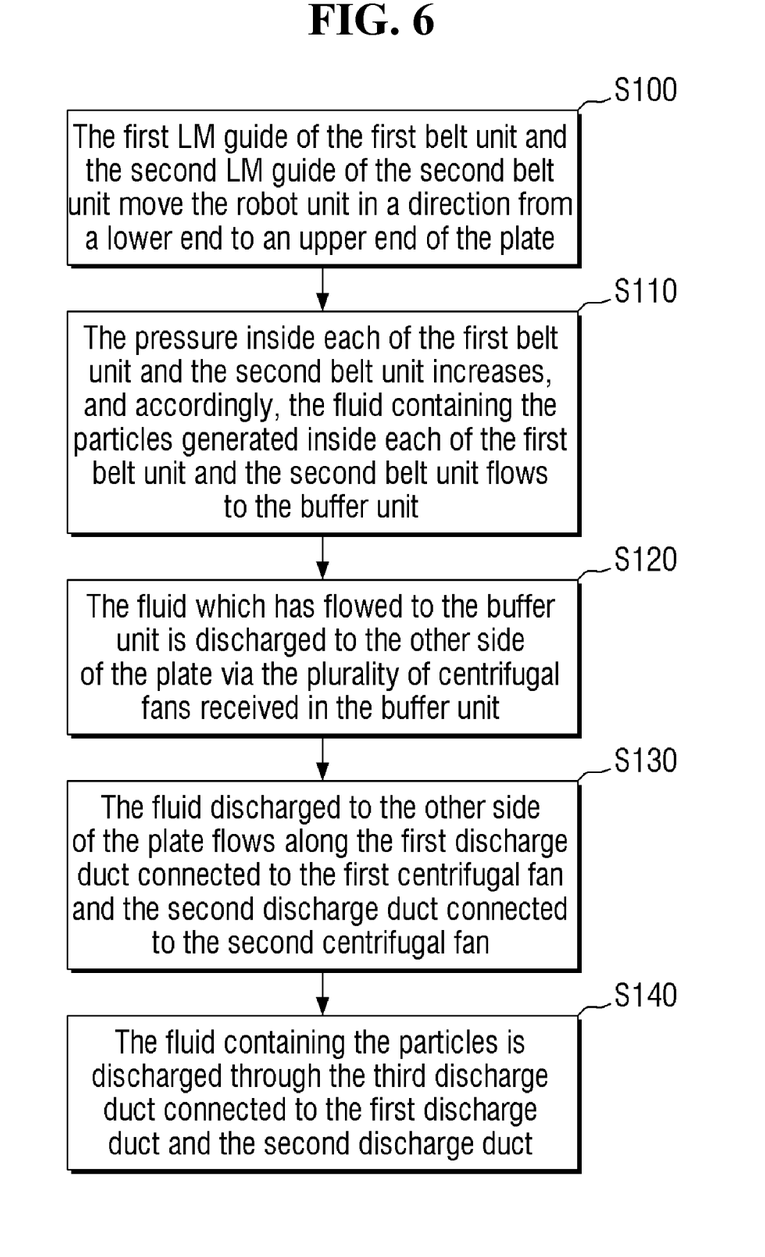
FIG. 6 is a flow chart illustrating a method for removing particles in a wafer transfer apparatus in accordance with some embodiments.
Figure 7:
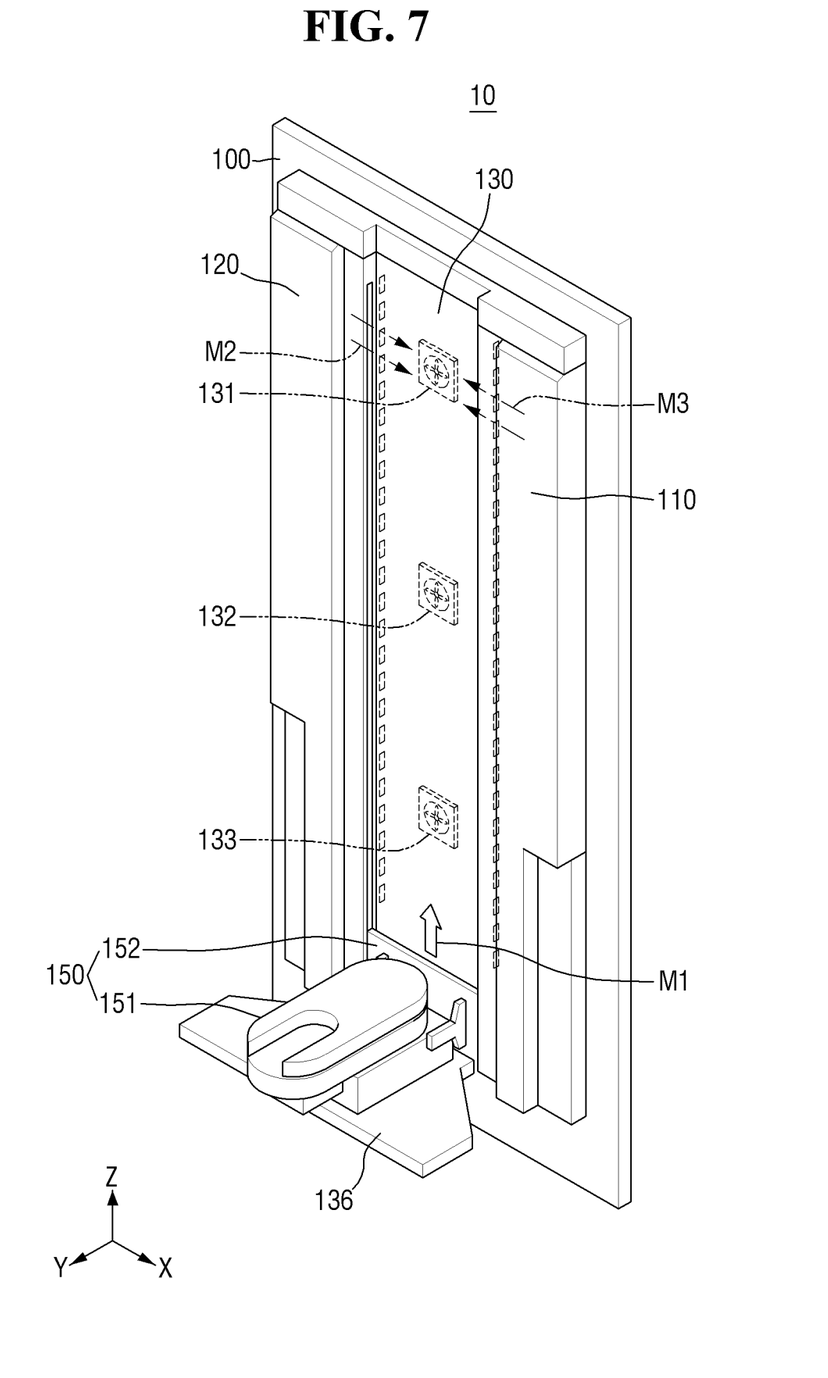
FIG. 7 is a perspective view illustrating a method for removing particles in a wafer transfer apparatus in accordance with some embodiments.
Figure 8:
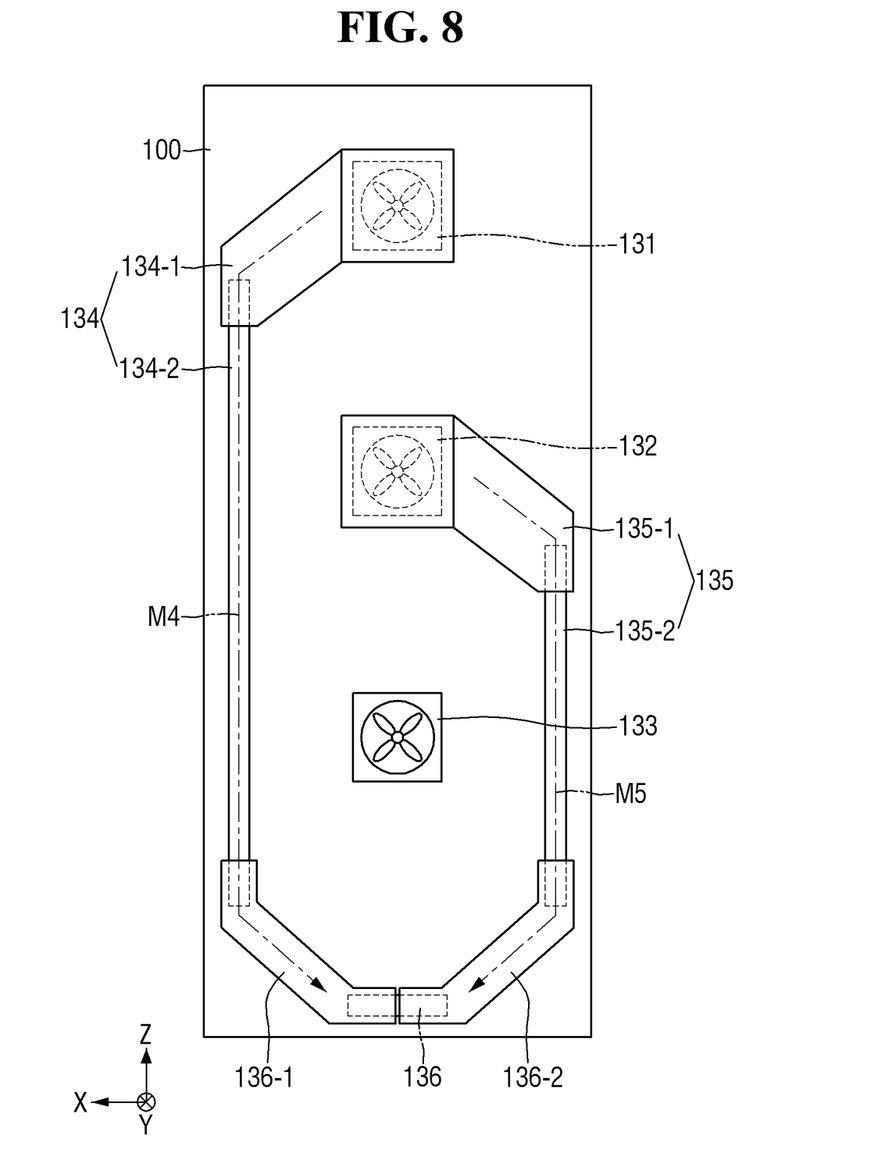
FIG. 8 is a diagram for illustrating a method for removing particles using a plurality of centrifugal fans and a plurality of discharge ducts according to some embodiments.

FIG. 6 is a flow chart illustrating a method for removing particles in a wafer transfer apparatus in accordance with some embodiments. FIG. 7 is a perspective view illustrating a method for removing particles in a wafer transfer apparatus in accordance with some embodiments. FIG. 8 is a diagram for illustrating a method for removing particles in a plurality of centrifugal fans and a plurality of discharge ducts according to some embodiments.

Referring to FIG. 6 to FIG. 8, the first LM guide 111 in the first belt unit 110, and the second LM guide 121 in the second belt unit 120 move the robot unit (150 in FIG. 2) in a direction from a lower end to an upper end of the first plate 100 in S100 of FIG. 6 as indicated by an arrow M1 in FIG. 7.

Then, in S110 of FIG. 6, due to the movement of the first LM guide 111 and the second LM guide 121, the pressure inside each of the first belt unit 110 and the second belt unit 120 increases, and accordingly, the fluid containing the particles inside each of the first belt unit 110 and the second belt unit 120 flows to the buffer unit 130 in each of directions as indicated by arrows M2 and M3 shown in FIG. 7.

Then, the fluid which has flowed to the buffer unit 130 is discharged to the other side of the first plate 100 via the plurality of centrifugal fans received in the buffer unit 130, for example, the first centrifugal fan 131, the second centrifugal fan 132, and the third centrifugal fan 133 in S120.

Subsequently, in S130, the fluid discharged to the other side of the first plate 100 flows in directions as indicated by arrows M4 and M5 (as shown in FIG. 8) along the first discharge duct 134 connected to the first centrifugal fan 131 and the second discharge duct 135 connected to the second centrifugal fan 132 among the plurality of centrifugal fans.

Finally, in S140, as shown in FIG. 8, the fluid containing the particles may be discharged through the third discharge duct 136 connected to the first discharge duct 134 and the second discharge duct 135. Thus, the particles may be prevented from leaking into the inside of the VFEM system of FIG. 1.

Figure 9:
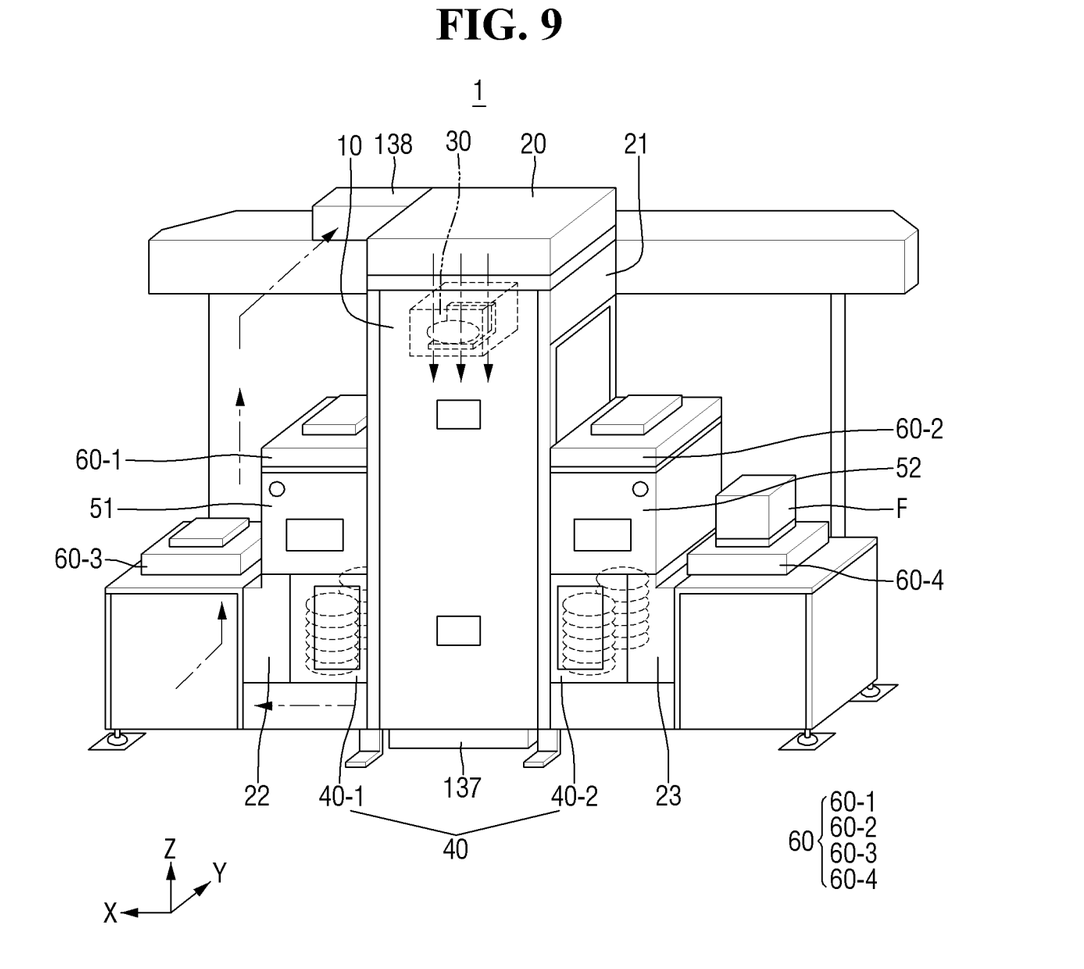
FIG. 9 is a diagram showing a flow direction in the VFEM system of gas discharged from the wafer transfer apparatus according to some embodiments.
Figure 10:
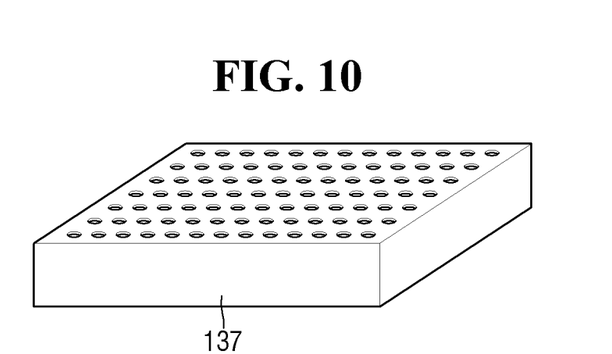
FIG. 10 is a perspective view of a perforated plate according to some embodiments.

FIG. 9 is a diagram showing a flow direction in the VFEM system of gas discharged from the wafer transfer apparatus according to some embodiments. FIG. 10 is a perspective view of a perforated plate according to some embodiments.

Referring to FIG. 6 to FIG. 8, the particles removed from the wafer transfer apparatus 10 as described above move in the VFEM system 1 as follows.

Referring to FIG. 8 to FIG. 10, the third discharge duct 136 may transfer the fluid containing the particles removed from the wafer transfer apparatus to the perforated plate 137 disposed under the third discharge duct 136. In some embodiments, the perforated plate 137 may have a structure in which a plurality of holes of a constant size are uniformly arranged, as shown in FIG. 10. The fluid passing through the perforated plate 137 may flow along the direction of the arrow through a structure (not shown) connected to the perforated plate 137 to a top connector 138. The fluid containing the particles which has flowed to the top connector 138 may be filtered in the topmost FFU 20 of the VFEM system 1 such that the particles are removed from the fluid and then the filtered fluid may be supplied into the VFEM system 1.

Referring to FIG. 1 to FIG. 10, the wafer transfer apparatus of the present disclosure as described above transports the wafer along the vertical direction due to the nature of the VFEM system 1. In this case, due to the movement of the first LM guide 111 of the first belt unit 110 and the second LM guide 121 of the second belt unit 120, friction may occur and thus the particles may be generated. Moreover, due to the movement of the first LM guide 111 and the second LM guide 121, the internal pressure rises at an upper end of each of the first belt unit 110 and the second belt unit 120. For this reason, the buffer unit 130 may be formed between the first belt unit 110 and the second belt unit 120 so that the particles do not leak into the VFEM system 1 and do not damage the wafer. That is, in accordance with the present disclosure, the buffer unit 130 may be disposed between the first belt unit 110 and the second belt unit 120, such that the leakage of the particles into the system 1 due to the pressure increase in each of the first belt unit 110 and the second belt unit 120 may be prevented. Moreover, according to the present disclosure, the plurality of centrifugal fans may be arranged inside the buffer unit 130 to further maximize such an effect. However, the present disclosure is not limited thereto.

In some embodiments, the buffer unit 130 of the wafer transfer apparatus 10 may not have the plurality of centrifugal fans, for example, the first centrifugal fan 131, the second centrifugal fan 132, and the third centrifugal fan 133. In this case, the fluid in the inner space of the buffer unit 130 may flow downwardly under the operation of the topmost FFU 20 of the VFEM system 1, and may pass through the perforated plate 137 located at the bottom of the VFEM system 1, and then may flow in the direction of the arrow, as shown in FIG. 9, and then may reach the topmost FFU 20 by way of the top connector 138. Then, the topmost FFU 20 may filter the fluid containing the particles such that the particles are removed from the fluid (air) and then may supply the clean air to the inside of the VFEM system 1.

Although the embodiments of the present disclosure have been described with reference to the accompanying drawings, the present disclosure is not limited to the above embodiments and may be implemented in various different forms. Those of ordinary skill in the technical field to which the present disclosure belongs will be able to understand that the present disclosure may be implemented in other specific forms without changing the technical idea or essential characteristics of the present disclosure. Therefore, it should be understood that the embodiments as described above are not restrictive but illustrative in all respects.

What is claimed is:

1. A wafer transfer apparatus comprising:
    a plate;
    a first belt unit on a first surface of the plate and including
        a first linear motion (LM) guide configured to move up and down;
    a second belt unit on the first surface of the plate and including a second LM guide configured to move up and down;
    a robot between the first belt unit and the second belt unit, wherein the robot is connected to the first LM guide and the second LM guide, and is configured to transfer a wafer in a vertical direction; and
    a buffer unit between the first belt unit and the second belt unit in a first direction, the buffer unit being between the plate and the robot in a second direction perpendicular to the first direction, wherein the buffer unit includes a plurality of centrifugal fans disposed in a space bounded by planes of inner walls of the first belt unit and the second belt unit, the plurality of centrifugal fans configured to discharge fluid from an inner space of the buffer unit to an outside of the buffer unit.

2. The wafer transfer apparatus of claim 1, wherein the buffer unit connects the first belt unit and the second belt unit.

3. The wafer transfer apparatus of claim 2,
wherein the plurality of centrifugal fans are disposed in the inner space of the buffer unit and are arranged in a line along a third direction that is different from the first direction and different from the second direction, and
wherein the plurality of centrifugal fans include:
a first centrifugal fan on the plate and at an upper level of the buffer unit;
a second centrifugal fan on the plate, and spaced apart from the first centrifugal fan, wherein the second centrifugal fan is under the first centrifugal fan; and
a third centrifugal fan on the plate and at a lower level of the buffer unit, wherein the third centrifugal fan is under the second centrifugal fan.

4. The wafer transfer apparatus of claim 3, wherein the buffer unit further includes:
a first discharge duct on an opposite side of the plate from the first belt unit, the first discharge duct covering a discharge hole of the first centrifugal fan; and
a second discharge duct on an opposite side of the plate from the second belt unit, the second discharge duct covering a discharge hole of the second centrifugal fan.

5. The wafer transfer apparatus of claim 4,
wherein each of the first discharge duct and the second discharge duct extends in an elongate manner downwardly along the third direction, and
wherein the first discharge duct and the second discharge duct are spaced apart from each other such that fluid from the first discharge duct and fluid from the second discharge duct do not interfere with each other.

6. The wafer transfer apparatus of claim 5,
wherein the buffer unit further includes a third discharge duct on the opposite side of the plate and located at a lower end of the plate beneath the first discharge duct and the second discharge duct,
wherein a first end of the third discharge duct is connected to the first discharge duct, and
wherein a second end of the third discharge duct is connected to the second discharge duct.

7. The wafer transfer apparatus of claim 2, further comprising:
a first fluid dispersion plate between the first belt unit and the buffer unit, wherein the first fluid dispersion plate is configured to control fluid flow from the first belt unit to the buffer unit; and
a second fluid dispersion plate between the second belt unit and the buffer unit, wherein the second fluid dispersion plate is configured to control fluid flow from the second belt unit to the buffer unit.

8. The wafer transfer apparatus of claim 7, wherein each of the first fluid dispersion plate and the second fluid dispersion plate has a plurality of holes arranged in a row along a third direction that is different from the first direction and different from the second direction.

9. The wafer transfer apparatus of claim 8, wherein diameters of the plurality of holes decrease as each of the first fluid dispersion plate and the second fluid dispersion plate extends downwardly along the third direction.

10. The wafer transfer apparatus of claim 1,
wherein the first belt unit further includes a first seal belt between the first LM guide and the robot to prevent particles inside the first belt unit from leaking to an outside of the first belt unit, and
wherein the second belt unit further includes a second seal belt between the second LM guide and the robot to prevent particles inside the second belt unit from leaking to an outside of the second belt unit.

11. A wafer transfer system comprising:
a main apparatus including:
a plate;
a first belt unit and a second belt unit disposed on one surface of the plate;
a buffer unit disposed between the first belt unit and the second belt unit, the buffer unit including a plurality of centrifugal fans configured to discharge fluid from an inner space of the buffer unit to an outside of the buffer unit, the plurality of centrifugal fans being disposed in a space bounded by planes of inner walls of the first belt unit and the second belt unit; and
a robot disposed between the first belt unit and the second belt unit, the robot being configured to transfer a wafer vertically along the buffer unit;
a first auxiliary apparatus on a left side of the main apparatus configured to supply the wafer to the main apparatus while a process is performed; and
a second auxiliary apparatus on a right side of the main apparatus configured to supply the wafer to the main apparatus while the process is performed.

12. The wafer transfer system of claim 11, wherein the main apparatus further includes a topmost fan filter unit (FFU) disposed on a top of the main apparatus, the topmost FFU configured to generate descending airflow into the main apparatus.

13. The wafer transfer system of claim 11,
wherein the first auxiliary apparatus includes a plurality of first loadports configured to house a plurality of wafers before the process is performed,
wherein the plurality of first loadports are arranged in a stepped manner,
wherein the second auxiliary apparatus includes a plurality of second loadports configured to house a plurality of wafers before the process is performed, and
wherein the plurality of second loadports are arranged in a stepped manner.

14. The wafer transfer system of claim 11, wherein the buffer unit connects the first belt unit and the second belt unit.

15. A method for removing particles in a wafer transfer apparatus, the method comprising:
providing the wafer transfer apparatus including:
a plate;
a first belt unit on a first surface of the plate and including a first linear motion (LM) guide movable up and down;
a second belt unit on the first surface of the plate and including a second LM guide movable up and down;
a robot between the first belt unit and the second belt unit, wherein the robot is connected to the first LM guide and the second LM guide, and is configured to transfer a wafer in a vertical direction; and
a buffer unit between the first belt unit and the second belt unit in a first direction, the buffer unit being between the plate and the robot in a second direction perpendicular to the first direction, wherein the buffer unit includes a plurality of centrifugal fans disposed in a space bounded by planes of inner walls of the first belt unit and the second belt unit, the plurality of centrifugal fans configured to discharge fluid from an inner space of the buffer unit to an outside of the buffer unit;

moving, by the first LM guide of the first belt unit and the second LM guide of the second belt unit, the robot in a direction from a lower end of the plate to an upper end of the plate, wherein due to the moving of the first LM guide and the second LM guide, a pressure inside each of the first belt unit and the second belt unit increases such that fluid containing particles generated inside each of the first belt unit and the second belt unit flows into an inside of the buffer unit; and discharging, by the plurality of centrifugal fans, the fluid containing the particles received in the inside of the buffer unit to the outside of the buffer unit.

16. The method of claim 15,
wherein the plurality of centrifugal fans are disposed in the inner space of the buffer unit and are arranged in a line along a third direction that is different from the first direction and different from the second direction, and
wherein the plurality of centrifugal fans include:
 a first centrifugal fan on the plate and at an upper level of the buffer unit;
 a second centrifugal fan on the plate, and spaced apart from the first centrifugal fan, wherein the second centrifugal fan is under the first centrifugal fan; and
 a third centrifugal fan on the plate and at a lower level of the buffer unit, wherein the third centrifugal fan is under the second centrifugal fan.

17. The method of claim 16,
wherein the wafer transfer apparatus further includes:
 a first discharge duct on an opposite side of the plate from the first belt unit, the first discharge duct covering a discharge hole of the first centrifugal fan; and
 a second discharge duct on an opposite side of the plate from the second belt unit, the second discharge duct covering a discharge hole of the second centrifugal fan, and
wherein the fluid discharged by the plurality of centrifugal fans flows along and in the first discharge duct and the second discharge duct.

18. The method of claim 17,
wherein each of the first discharge duct and the second discharge duct extends in an elongate manner downwardly along the third direction, and
wherein the first discharge duct and the second discharge duct are spaced apart from each other such that fluid from the first discharge duct and fluid from the second discharge duct do not interfere with each other.

19. The method of claim 18,
wherein the wafer transfer apparatus further includes a third discharge duct on an opposite side of the plate and located at a lower end of the plate beneath the first discharge duct and the second discharge duct,
wherein a first end of the third discharge duct is connected to the first discharge duct,
wherein a second end of the third discharge duct is connected to the second discharge duct, and
wherein the fluid flows along and in the first discharge duct and the second discharge duct and then is discharged through the third discharge duct out of the wafer transfer apparatus.

* * * * *